United States Patent
Rebholz-Goldmann

(10) Patent No.: US 7,362,147 B2
(45) Date of Patent: Apr. 22, 2008

(54) INTEGRATED CIRCUIT

(75) Inventor: Peter Rebholz-Goldmann, Neuenstadt (DE)

(73) Assignee: Atmel Germany GmbH, Heilbronn (DE)

( * ) Notice: Subject to any disclaimer, the term of this patent is extended or adjusted under 35 U.S.C. 154(b) by 109 days.

(21) Appl. No.: 11/450,299

(22) Filed: Jun. 12, 2006

(65) Prior Publication Data

US 2006/0279339 A1    Dec. 14, 2006

(30) Foreign Application Priority Data

Jun. 10, 2005   (DE) .................. 10 2005 028 128

(51) Int. Cl.
*H03K 3/00*   (2006.01)

(52) U.S. Cl. .................. 327/108; 327/170; 327/377

(58) Field of Classification Search .............. 327/108, 327/112, 170, 377
See application file for complete search history.

(56) References Cited

U.S. PATENT DOCUMENTS

| 4,612,466 | A | * | 9/1986 | Stewart | .................. 327/437 |
| 5,289,051 | A | | 2/1994 | Zitta | |
| 6,137,322 | A | * | 10/2000 | Ten Eyck | .................. 327/112 |
| 6,177,819 | B1 | * | 1/2001 | Nguyen | .................. 327/112 |
| 6,556,407 | B2 | | 4/2003 | Elliott et al. | |
| 6,844,755 | B2 | * | 1/2005 | Ajit | .................. 326/32 |

FOREIGN PATENT DOCUMENTS

| DE | 41 31 783 C1 | 2/1993 |
| DE | 198 55 604 C1 | 6/2000 |

* cited by examiner

*Primary Examiner*—Kenneth B. Wells
(74) *Attorney, Agent, or Firm*—Muncy, Geissler, Olds & Lowe PLLC

(57) ABSTRACT

An integrated circuit is disclosed that includes a MOS output stage transistor, a gate terminal for applying a drive signal, which controls the turning on and off of the output stage transistor, a charge transistor, which when the output stage transistor is turned on supplies a gate electrode of the output stage transistor with a charging current, and a discharge transistor, which when the output stage transistor is turned off supplies the gate electrode of the output stage transistor with a discharge current. Also, a turn-off control unit is disclosed, which when the output stage transistor is turned off supplies the gate electrode with an additional discharge current during a second time interval and turns off the additional discharge current after the second time interval.

10 Claims, 2 Drawing Sheets

INTEGRATED CIRCUIT

This nonprovisional application claims priority under 35 U.S.C. § 119(a) on German Patent Application No. DE 10 2005 028 128, which was filed in Germany on Jun. 10, 2005, and which is herein incorporated by reference.

BACKGROUND OF THE INVENTION

1. Field of the Invention

The present invention relates to an integrated circuit with a MOS output stage transistor.

2. Description of the Background Art

Integrated circuits are used, for example, in the area of field bus systems. In this case, a bus line of the field bus system is connected, for example, to a drain electrode of the output stage transistor, and a source electrode of the output stage transistor is connected to ground. The bus line is connected to an operating voltage via a pull-up resistor. If all participants in the bus system drive their respective output stage transistor in such a way that it blocks, an operating voltage is present at the bus line. If at least one of the participants switches on its respective output stage transistor, a ground potential is present at the bus line.

Because, the operating voltage of the bus system is typically greater than a supply voltage of the bus participants, the bus line is not connected directly to a bus participant or its control unit, for example, a microprocessor. In this case, the control unit provides only a drive signal at its supply voltage level, which causes the output stage transistor to turn on or off, and applies the drive signal to a gate terminal of the integrated circuit.

To change a switching state of the output stage transistor, a charge transistor and a discharge transistor are typically provided, which supply a charging current or a discharge current to the gate electrode of the output stage transistor for switching or recharging a gate voltage. For this purpose, a charging current source is looped in series with the charge transistor between the supply voltage and the gate electrode, and the discharge transistor in series with a discharge current source between the gate electrode and ground. The current sources during a recharging process supply a substantially constant current, as a result of which more or less constant signal change rates or switching edges result.

The signal courses produced by switching the output stage transistor on the bus line must typically meet certain boundary conditions specified in a bus specification. These include, for example, a signal rise rate or a signal reduction rate, which are also called a slew rate, and switching time durations from a low to a high level or from a high to a low level of the bus signal, which ideally are to be equal in length. At the same time, a time delay between the drive signal provided by the control unit and the associated bus signal is to be as small as possible.

German patent publication DE 41 31 783 C1, which corresponds to U.S. Pat. No. 5,289,051, discloses a generic circuit configuration for driving a MOS power transistor with connected auxiliary current sources to provide an additional charging or discharge current.

A method and a device for driving a power output stage is known from German patent publication DE 198 55 604 C1, which corresponds to U.S. Pat. No. 6,556,407, in which a power transistor is charged or discharged with different charging current intensities.

SUMMARY OF THE INVENTION

It is therefore an object of the present invention to provide an integrated circuit, which has a small delay between a drive signal provided by a control unit and an associated bus signal as well as defined switching edges.

According to the invention, a turn-off control unit is provided, which when the output stage transistor is turned off supplies a gate electrode with an additional discharge current during a first time interval and turns off the additional discharge current after the first time interval. The additional current causes a rapid discharging of the gate electrode or of capacitors, located between the gate electrode and other areas of the transistor, for example, a gate-drain capacitor or a gate-source capacitor. This reduces the delay time between the drive signal and the associated bus signal.

The turn-off control unit has a voltage determination unit to determine the voltage at the drain electrode of the output stage transistor, the unit which emits a drain voltage signal dependent on the voltage present at the drain electrode of the output stage transistor, a turn-off control logic unit, which receives the drive signal and the drain voltage signal and depending thereon generates a discharge current control signal, a transmission gate driven by the discharge current control signal, and a bipolar fast-discharge transistor, whereby the transmission gate is looped in series with the collector-emitter section of the fast-discharge transistor between the gate electrode of the output stage transistor and a reference potential, for example, ground. This enables the switching on or off of an additional discharge current flowing through the transmission gate and the fast-discharge transistor as a function of the switching state or the drain voltage of the output stage transistor. If the output stage transistor is to be turned off, first the gate electrode is discharged with the maximum current intensity, i.e., the turn-off control logic unit emits a discharge current control signal in such a way that the transmission gate becomes transparent and the fast-discharge transistor conductive, so that the charge can dissipate via this path from the gate electrode of the output stage transistor. This should occur, however, only during the first time interval, i.e., for example, until a time at which there is a more or less supply voltage level at the drain electrode of the output stage transistor. When this voltage level is exceeded (this is detected by the voltage determination unit), the transmission gate is blocked by the turn-off control logic unit, so that charge dissipation can no longer occur via this path.

In a further embodiment of the integrated circuit, a turn-on control unit is provided, which when the output stage transistor is turned on supplies the gate electrode with an additional charging current during a second time interval and turns off the additional charge current after the second time interval. The turn-on control unit can have a switching state determination unit for determining the switching state of the output stage transistor, the unit which emits a switching state signal dependent on the switching state of the output stage transistor, a turn-on control logic unit, which receives the drive signal and the switching state signal and depending thereon generates a charging current control signal, and a fast-charge transistor driven by the charge current control system, to provide the additional charging current, the transistor being looped in between a supply voltage and the gate electrode of the output stage transistor. This enables a switching off of the additional charging current as a function of the switching state of the output stage transistor. If the output stage transistor is to be turned on, first the gate electrode is charged with a maximum current intensity. To this end, the turn-on control logic unit emits the charging current control signal to the fast-charge transistor in such a way so that this is or becomes conductive, as a result of which the additional charging current is activated. This should occur, however, only during the second time interval, i.e., for example, until a time at which the output stage transistor begins to become conductive. Until this time, there is virtually no change in the signal present at the drain terminal of the output stage transistor. With an incipient conductivity of the output stage transistor, which is detected by the switching state determination unit and is output to the turn-on control logic unit, the turn-on control logic unit emits the charging current control signal to the fast-charge transistor in such a way that the transistor blocks, as a result of which the additional charging current is turned off. The gate electrode of the output stage transistor is then charged exclusively by the charge transistor. A switching delay can be reduced in this way without a change in the edge steepness of the switching signal.

In a further embodiment of the integrated circuit, the switching state determination unit has a first sensor transistor, whose gate electrode is connected to the gate electrode of the output stage transistor, and a first sensor current source, whereby the first sensor current source is looped in series with the drain source section of the first sensor transistor between a supply voltage and a reference potential, particularly ground, and the switching state signal is present at the drain electrode of the first sensor transistor. The first sensor transistor emulates the output stage transistor and is made in such a way that it essentially has substantially identical electrical properties. This can be achieved, for example, inter alia by placing the sensor transistor in the vicinity of the output stage transistor. If a voltage at the gate electrode of the first sensor transistor, which is also present at the gate electrode of the output stage transistor, is still not sufficient to switch on the sensor transistor, the supply voltage level is present more or less at its drain electrode. This is an indication that the output stage transistor is also still not conductive. If the voltage at the gate electrode of the first sensor transistor has increased so far that the first sensor transistor begins to become conductive (i.e., the current impressed by the first sensor current source due to the declining drain-source resistance of the sensor transistor is no longer sufficient to provide the total supply voltage to the drain terminal), an incipient conductivity of the output stage resistor can also be inferred. This information can be used to switch off the additional charging current.

In a further embodiment of the integrated, the voltage determination unit has a second sensor transistor, whose gate electrode is connected to the supply voltage, and a second sensor current source, whereby the drain-source section of the second sensor transistor and the second sensor current source are looped in series between the drain electrode of the output stage transistor and a reference potential, particularly ground, and the drain voltage signal is present at the source electrode of the second sensor transistor. In this way, a drain voltage signal can be obtained simply for evaluation by the turn-off control logic unit, whereby the drain voltage signal, because of the supply voltage present at the gate electrode of the second sensor transistor, cannot exceed a supply voltage level minus a threshold voltage of the second sensor transistor, also when the voltage at the drain electrode of the output stage transistor becomes greater than this value.

In a further embodiment of the integrated circuit, the turn-off control unit has a fast-discharge release transistor, a fast-discharge release transistor drive unit for driving the fast-discharge release transistor, which receives the voltage present at the base electrode of the fast-discharge transistor and as a function thereof switches on or blocks the fast-discharge release transistor, and a fast-discharge current source, whereby a drain-source section of the fast-discharge release transistor and the fast-discharge current source are looped in series between the base electrode of the fast-discharge transistor and a reference potential, particularly ground. The base electrode of the fast-discharge transistor is supplied by the fast-discharge current source, which can be switched on or off with the aid of the fast-discharge release transistor, with a current that makes the fast-discharge transistor conductive and thereby causes a charge transport from the gate electrode of the output stage transistor in the direction of the reference potential. Discharging of the gate electrode is accelerated in this way. The driving occurs hereby by the rapid discharge release transistor drive unit, which switches on or blocks the fast-discharge release transistor as a function of the voltage present at the base electrode of the fast-discharge transistor. Overall, a multi-stage operation of the turn-off control unit is thereby possible. In a first operating mode, the discharge current control signal is active; i.e., the transmission gate driven by the discharge current control signal is transparent and the fast-discharge release transistor drive unit switches on the fast-discharge release transistor; i.e., the fast-discharge current source causes the fast-discharge transistor to be as low-impedance as possible. Overall, this leads to a maximum discharge rate of the gate voltage of the output stage transistor. In a second operating mode, the discharge current control signal remains active, but the fast-discharge current source is deactivated by the fast-discharge release transistor. This causes a reduction of the discharge rate. A change to the second mode of operation can occur, for example, when the output stage transistor just begins to block. In the second operating mode, an adjustable increase rate of the signal applied at the drain electrode of the output stage transistor can then be effected up to a specific voltage level at the drain electrode of the output stage transistor. In a third operating mode, the discharge current control signal is not active (i.e., the transmission gate is closed), and the fast-discharge current source is deactivated. A discharge of the gate electrode of the output stage transistor now occurs exclusively via the discharge transistor.

In a further embodiment of the integrated circuit, the turn-off control unit can have an integration capacitor and an integration current source, whereby the integration capacitor and the integration current source are looped in series between the drain voltage signal and a reference potential, particularly ground, and a connecting node between the integration capacitor and the integration source current is connected to the base electrode of the fast-discharge transistor. In this way, a discharge voltage, declining ramp-like, at the base electrode of the fast-discharge transistor can be generated, whereby due to the connection of the integration capacitor to the drain voltage signal a feedback path between the base electrode of the fast-discharge transistor and the drain voltage of the output stage transistor is formed and thereby the drain voltage course of the output stage transistor is also determined by the voltage course at the base electrode of the fast-discharge transistor. Based on this configuration, the voltage increase rate or the slew rate at the output of the output stage transistor can be adjusted, whereby this is determined substantially by the current intensity of the integration current source and the capacitance of the integration capacitor; i.e., this parameter can be adjusted precisely by suitable dimensioning of these components.

In yet a further embodiment, a pull-down resistor can be looped in between the gate electrode of the output stage transistor and a reference potential, particularly ground, and a compensation unit are provided, which compensates for a current, caused by the pull-down resistor, from the gate electrode to the reference potential. In certain operating modes of the integrated circuit, the pull-down resistor prevents the gate electrode of the output stage transistor from being at a so-called floating potential, as a result of which a too high voltage can arise at the gate electrode. Nevertheless, the pull-down resistor leads to a voltage-dependent current from the gate electrode to the reference potential, as a result of which the slew rate of the output signal changes as a function of the gate voltage. Because the compensation unit compensates for this current, a constant recharge current is supplied to the gate electrode or to a gate-drain capacitor and a gate-source capacitor of the output stage transistor; i.e., the output voltage or the voltage at the drain electrode of the output stage transistor changes with a defined slew rate.

In a further embodiment of the integrated circuit, a compensation unit can have a sensor resistor, whose electrical properties coincide substantially with the electrical properties of the pull-down resistor, a voltage follower unit, which taps off the voltage present at the pull-down resistor in a high-impedance manner and applies it to the sensor resistor in a low-impedance manner, a current measuring unit, which measures the current flowing through the sensor resistor, and a controlled compensation current source for supplying a compensation current to the gate electrode of the output stage transistor. The sensor resistor emulates the pull-down resistor with respect to its electrical properties. The voltage at the pull-down resistor is tapped off in a high-impedance manner with the aid of the voltage follower unit, which functions as an impedance converter, and applied to the sensor resistor in a low-impedance manner. The current, which arises at the sensor resistor and whose current intensity corresponds to that at the pull-down resistor, is measured and supplied to the gate electrode of the output stage transistor. A current caused by the pull-down resistor can be compensated in this manner.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
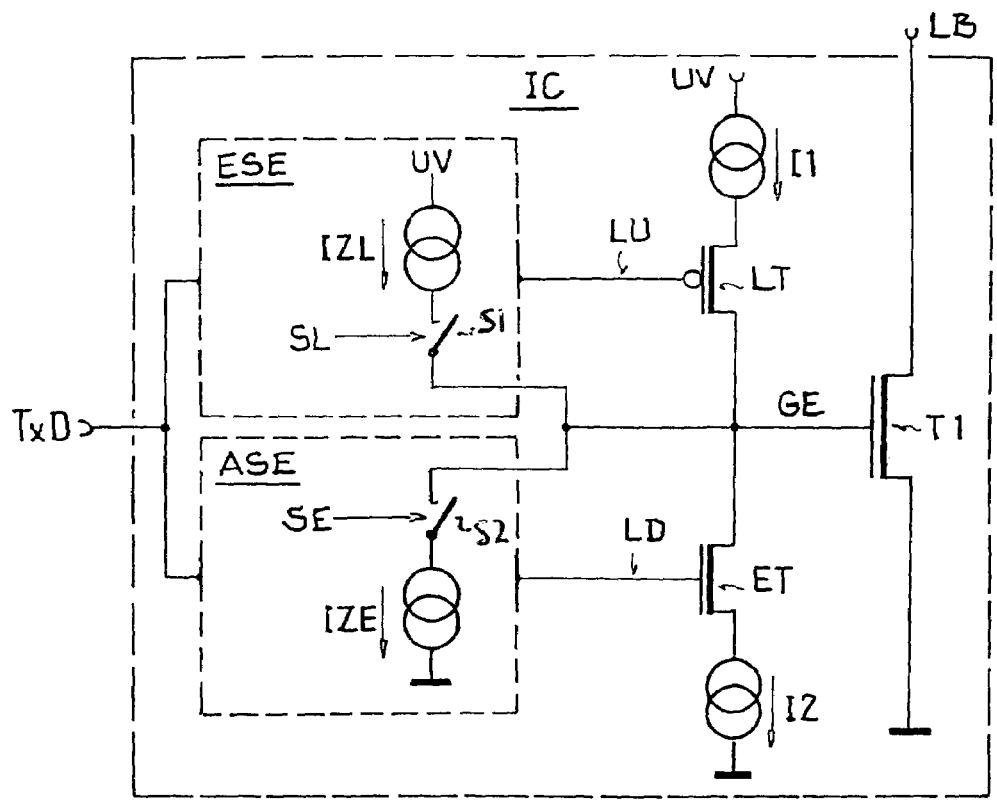
FIG. 1 illustrates a block diagram of an integrated circuit according to an embodiment of the present invention.

FIG. 1 shows a block diagram of an integrated circuit IC. The integrated circuit IC acts as a bus driver for a Local Interconnect Network (LIN) bus, but can also be used for other field buses with appropriate adjustment.

The IC comprises a gate terminal TxD, to which a drive signal can be applied, which controls the turning on and off of an NMOS output stage transistor T1, and a LIN bus terminal LB, which can be connected to a bus line (not shown). The drive signal can be generated, for example, by a bus participant (not shown) in the form of a microprocessor, whereby a microprocessor output or a microprocessor port can be connected directly to the gate terminal TxD.

To drive the output stage transistor T1, a turn-on control unit ESE and a turn-off control unit ASE, a PMOS charge transistor LT, and an NMOS discharge transistor ET are provided, whereby current sources I1 and I2 are assigned to the transistors LT and ET, which in switched-on transistors LT or ET provide a charging or discharge current.

The charge transistor LT, driven by a charge signal LU, when the output stage transistor T1 is turned on, supplies the gate electrode GE of the output stage transistor T1 with a charging current, whose current intensity is determined by the current source I1. The discharge transistor ET, driven by a discharge signal LD, when the output stage transistor T1 is turned off, supplies the gate electrode GE thereof with a discharge current, whose current intensity is determined by the current source I2.

The turn-on control unit ESE comprises a current source IZL and a switch S1, driven by a charging current control signal SL, which are looped in series between a supply voltage UV of the integrated circuit IC and the gate electrode GA of the output stage transistor T1. The switch S1 is driven in such a way that when the output stage transistor T1 is turned on, the gate electrode GE thereof is supplied with an additional charging current during a first time interval, i.e., the current provided by the current source IZL, and the additional charging current is turned off after the first time interval. The charge transistor LT and the associated current source IZL are not part of the turn-on control unit ESE in the shown exemplary embodiment, but can also be contained therein.

The turn-off control unit ASE comprises a current source IZE and a switch S2, driven by a discharge current control signal SE, which are looped in series between the gate electrode GE of the output stage transistor T1 and ground. The switch S2 is driven in such a way that when the output stage transistor T1 is turned off, the gate electrode GE thereof is supplied with an additional discharge current during a second time interval, i.e., the current provided by the current source IZE, and the additional charging current is turned off after the second time interval. The discharge transistor ET and the associated current source IZE are not part of the turn-off control unit ASE in the shown exemplary embodiment, but can also be contained therein.

Figure 3:
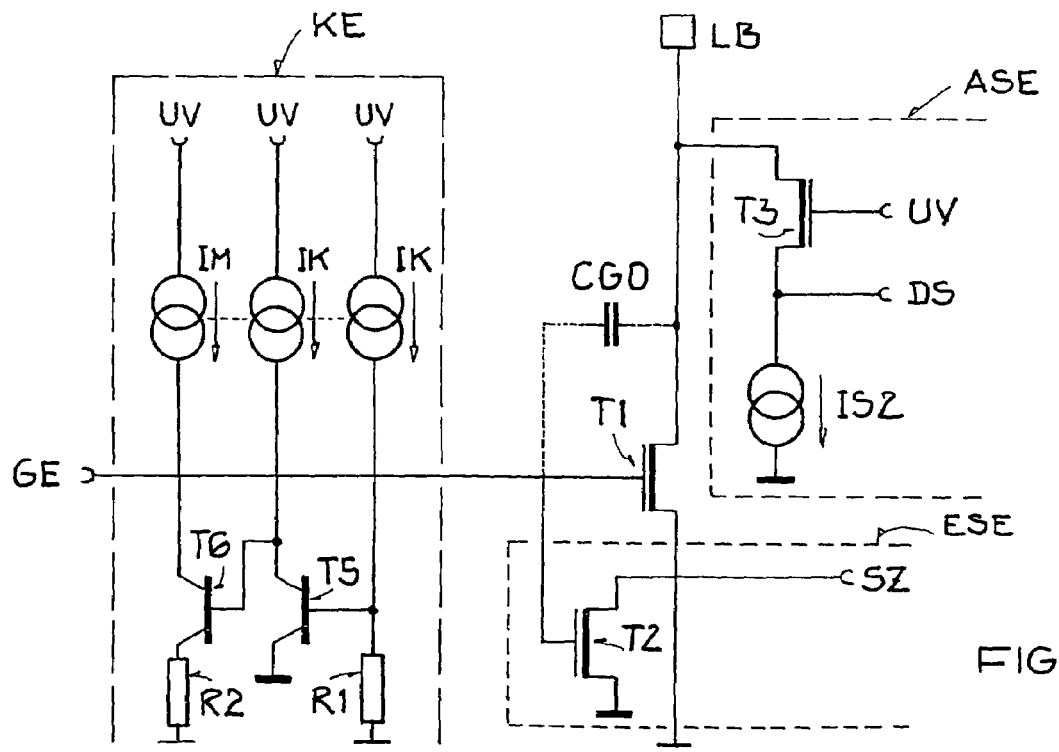
FIG. 3 shows a circuit diagram of a second part of the integrated circuit of FIG. 1.
Figure 2:
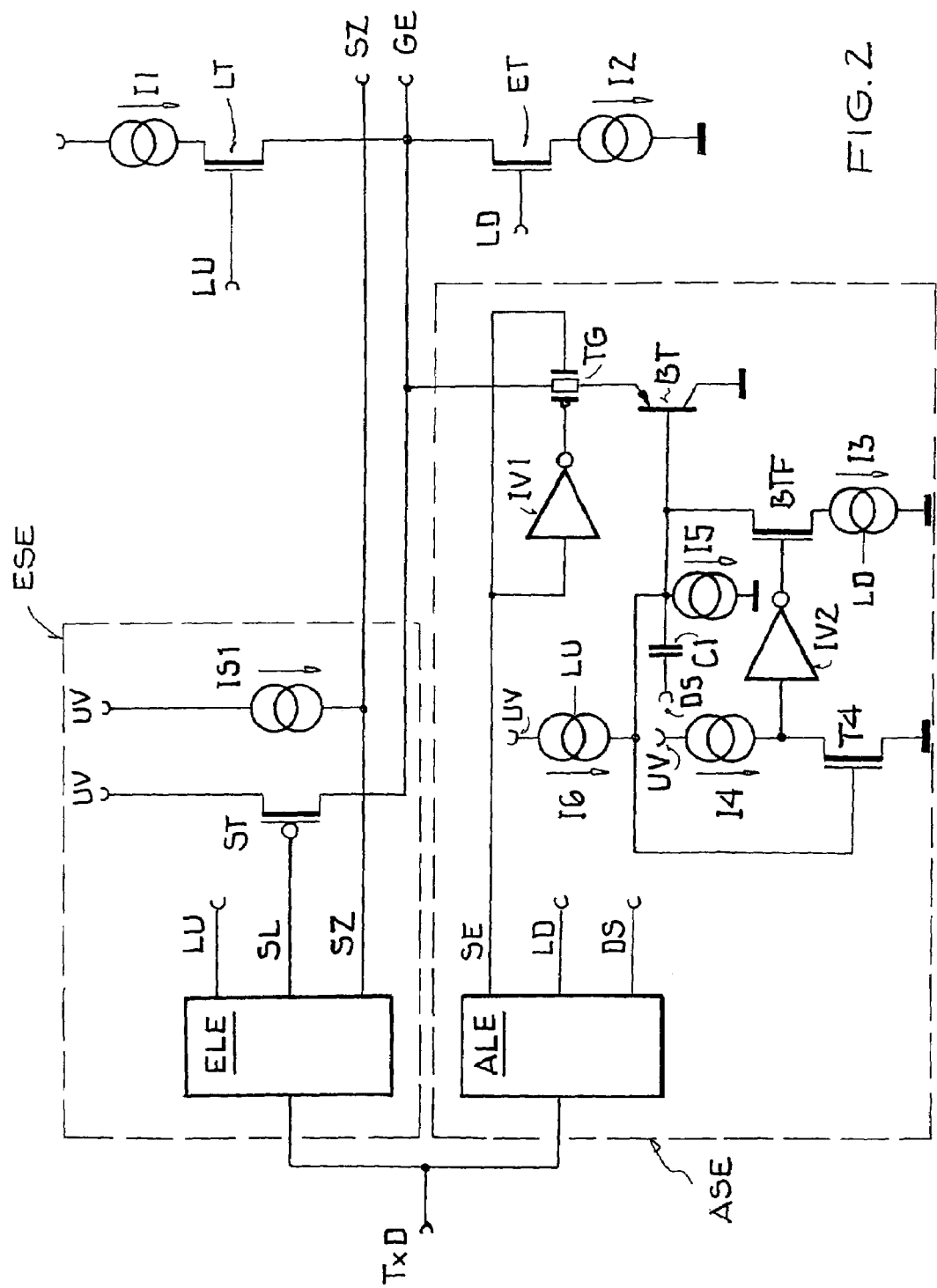
FIG. 2 shows a circuit diagram of a first part of the integrated circuit of FIG. 1.

FIGS. 2 and 3 each show partial circuit diagrams of the integrated circuit IC of FIG. 1. The circuit diagrams were split here for reasons of clarity.

To drive the output stage transistor T1, a compensation unit KE is provided in addition to the units ESE and ASE already shown in FIG. 1.

The function of the IC shown in FIGS. 2 and 3 is described by way of example below for a turning on and a subsequent turning off of the output stage transistor T1.

In an initial state, the output stage transistor T1 is turned off, i.e., it blocks. The operating voltage is subsequently present at the LIN bus terminal LB. This is applied via a pull-up resistor (not shown), which is looped in between the operating voltage and the bus line. The operating voltage is typically considerably greater than the supply voltage UV of the IC. The operating voltage can be, for example, about 40 V and the supply voltage UV 3 V or 5 V.

At gate terminal TxD, a control signal is now applied, which is to cause the output stage transistor T1 to turn on.

The control signal is applied in each case to the turn-on control logic unit ELE and to a turn-off control logic unit ALE. When the control signal signals a turning on of the output stage transistor T1, the turn-off control logic unit ALE deactivates the discharge signal LD and the discharge current control signal SE, as a result of which the turn-off control unit ASE and the discharge transistor ET are deactivated, and the turn-on control logic unit ELE activates the charge signal LU. The charge signal LU switches on the charge transistor LT, as a result of which the current source I1 supplies a base current to the gate electrode GE of the output stage transistor T1. The charging current control signal SL is activated depending on the switching state signal SZ.

The switching state signal SZ is generated by a switching state determination unit in the form of a MOS sensor transistor T2 and a sensor current source IS1, whereby the sensor current source IS1 is looped in series with the drain-source section of the sensor transistor T2 between the supply voltage UV and ground and the switching state signal SZ is present at the drain electrode of the sensor transistor T2. The switching state signal SZ indicates the switching state of the output stage transistor T1. When T1 blocks, SZ has a high level. When T1 conducts or is switched on, SZ has a low level. The sensor transistor T2 is made or dimensioned in such a way that it has substantially the same electrical properties as the output stage transistor T1.

The turn-on control logic unit ELE activates the charging current control signal SL in the shown case, because the switching state signal SZ indicates a blocked output stage transistor T1. The activated charging current control signal SL switches on a PMOS fast-charge transistor ST looped in between the supply voltage UV and the gate electrode GE of the output stage transistor T1, as a result of which an additional charging current is supplied to the gate electrode GE of T1. This accelerates a charging of gate capacitors of T1 (by way of example, a gate-drain capacitor CGD is shown in FIG. 3); i.e., the time duration until T1 begins to conduct declines.

The transistor ST remains active during a first time interval until the switching state signal SZ indicates an incipient conductivity of the output stage transistor T1. Until this time, there is virtually no change in the signal applied to the drain terminal of the output stage transistor T1. With an incipient conductivity of the output stage transistor T1, the turn-on control logic unit ELE emits the charging current control signal SL to the fast-charge transistor ST in such a way that the transistor blocks, as a result of which the additional charging current is turned off. The gate electrode GE of the output stage transistor T1 is then charged exclusively by the charge transistor LT. A switching delay can be reduced in this way without a change in the edge steepness of the switching signal.

After the turning on of the output stage transistor T1 has been completed, the ground voltage is more or less present at the LIN bus terminal LB. At gate terminal TxD, a control signal is now applied from the outside, which is to cause the output stage transistor T1 to turn off.

The turn-on control logic unit ELE hereupon deactivates the charge signal LU, as a result of which the charge transistor LT blocks. The charging current control signal SL remains deactivated.

The turn-off control logic unit ALE activates the discharge signal LD. The discharge signal LD switches on the discharge transistor ET, as a result of which the current source I2 removes a base current from the gate electrode GE of the output stage transistor T1 in the direction of ground. A discharge current control signal SE is activated depending on a drain voltage signal DS.

The drain voltage signal DS is generated by a voltage determination unit in the form of a second sensor transistor T3, whose gate electrode is connected to the supply voltage UV, and a second sensor current source IS2, whereby the drain-source section of the second sensor transistor T3 and the second sensor current source IS2 are looped in series between the drain electrode of the output stage transistor T1 and ground, and the drain voltage signal DS is present at the source electrode of the second sensor transistor T3. The drain voltage signal DS is evaluated by the turn-off control logic unit ALE, whereby the drain voltage signal DE because of the supply voltage UV, present at the gate electrode of the second sensor transistor T3, cannot exceed a supply voltage level minus a threshold voltage of the second sensor transistor T3, also when the voltage at the drain electrode of the output stage transistor T1 becomes greater than this value.

The turn-off control logic unit ALE activates the discharge current control signal SE in the shown case, because the drain voltage signal DS indicates a drain voltage of the output stage transistor T1, which is within the range of ground voltage; i.e., the output stage transistor T1 is switched on. In this case, the gate electrode of the output stage transistor T1 during a second time interval is to be supplied with an additional discharge current, to accelerate a blocking of T1.

The activated discharge current control signal SE in conjunction with an inverter IV1 switches a transmission gate TG transparently, which is looped in series with the collector-emitter section of a bipolar pnp fast-discharge transistor BT between the gate electrode GE of the output stage transistor T1 and ground.

An NMOS fast-discharge release transistor BTF and a fast-discharge current source I3 are looped in between the base electrode of the fast-discharge transistor BT and ground. The fast-discharge current source I3 is driven by the discharge signal LD and is only active with an active discharge signal LD. The fast-discharge release transistor BTF is driven by a fast-discharge release transistor control unit in the form of an NMOS transistor T4, whose gate electrode is connected to the base electrode of the fast-discharge transistor BT, a current source I4, and an inverter IV2. The current source I4 is looped in series with the drain-source section of the transistor T4 between the supply voltage UV and ground. The drain voltage of the transistor T4 is used as the input signal for the inverter IV2. The gate electrode of the fast-discharge release transistor BTF is supplied with an output signal of the inverter IV2.

An integration capacitor C1 and an integration current source I5 are looped in series between the drain voltage signal DS and ground, whereby a connecting node between the integration capacitor C1 and the integration current source I5 is connected to the base electrode of the fast-discharge transistor BT.

A current source I6 driven by the charge signal LU is looped in between the supply voltage and the base electrode of the fast-discharge transistor BT. The current source 16 is active only with an active charge signal.

As described above, at the beginning of the discharge process, the signal LU is deactivated and the signal LD activated. The discharge current control signal SE is also active, because the drain voltage signal DS signals a low voltage, i.e., a switched-on output stage transistor T1. The current source 16 charges the integration capacitor C1 with an active charge signal LU to the supply voltage level. After the deactivation of the charge signal LU and the activation of the discharge signal LD, the integration capacitor C1 is discharged from the current source 15 and the fast-discharge current source 13, because the fast-discharge release transistor BTF is switched on at this time.

The switching on of the fast-discharge release transistor BTF is effected by the gate voltage of transistor T4, which is substantially identical to the voltage at the integration capacitor, having more or less a supply voltage level at this time. The transistor T4 is switched on subsequently. The drain voltage of transistor T4 then has a low level. In conjunction with inverter IV2, the fast-discharge release transistor BTF is subsequently switched on; i.e., fast-discharge current source 13 discharges the integration capacitor C1, in addition to the integration current 15.

The gate electrode GE of the output stage transistor T1 is now discharged initially with a maximum current intensity. However, this should not occur until the output stage transistor T1 just begins to block. Subsequently, the additional discharge current is to be determined only by the integration current source 15 until the elapse of the second time interval.

For this purpose, the discharge current control signal SE remains active but the fast-discharge current source 13 is deactivated by the fast-discharge release transistor BTF. This causes a reduction of the discharge rate. A turn-off threshold of the fast-discharge release transistor BTF is adjusted by suitable dimensioning of transistor T4. Over the course of the discharge of the integration capacitor, the voltage at the gate electrode of transistor T4 declines i.e., its drain-source resistance increases. The increase in the drain voltage at transistor T4 can be adjusted by dimensioning in such a way that a high level is established at the drain electrode of T4 just when the output stage transistor T1 begins to block. The result is that inverter IV2 deactivates or blocks the fast-discharge release transistor BTF at this threshold.

With a blocked fast-discharge release transistor BTF, a discharge voltage, declining ramp-like, at the base electrode of the fast-discharge transistor BT can be generated, whereby due to the connection of the integration capacitor C1 to the drain voltage signal DS, a feedback path between the base electrode of the fast-discharge transistor BT and the drain voltage of the output stage transistor T1 is formed, and the drain voltage course of the output stage transistor T1 is also determined by the voltage course at the base electrode of the fast-discharge transistor BT. Based on this configuration, the voltage increase rate or the slew rate at the output of the output stage transistor T1 can be adjusted, whereby this is determined substantially by the current intensity of the integration current source 15 and the capacitance of the integration capacitor C1 i.e., this parameter can be adjusted precisely by suitable dimensioning of these components.

Starting at an adjustable level of the drain voltage signal DS, the turn-off control logic unit ALE deactivates the discharge current control signal SE. This can occur, for example, in the range of the supply voltage minus the threshold voltage of transistor T3. After the deactivation of the discharge current control signal SE, a discharging of the gate electrode GE of T1 occurs only by the discharge transistor ET in conjunction with the current source I2.

The compensation unit KE comprises a pull-down resistor R1, which is looped in between the gate electrode of the output stage transistor T1 and ground, and a compensation unit. The compensation unit comprises a sensor resistor R2, whose electrical properties coincide substantially with the electrical properties of the pull-down resistor, a voltage follower unit in the form of bipolar transistors T5 and T6, said unit which taps off the voltage applied at the pull-down resistor R1 in a high-impedance manner and applies it to the sensor resistor R2 in a low-impedance manner, a current measuring unit IM, which measures the current flowing through the sensor resistor R2, and a controlled compensation current source IK for supplying a compensation current to the gate electrode of the output stage transistor. The pull-down-resistor R1 is shown here as part of the compensation unit KE, but it can also be located outside the compensation unit KE.

The compensation unit KE compensates for a current caused by the pull-down resistor R1 from the gate electrode of the output stage transistor to ground.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. An integrated circuit comprising:
    an output stage transistor having a gate electrode;
    a gate terminal for applying a drive signal to control a turning on and off of the output stage transistor;
    a charge transistor, which, when the output stage transistor is turned on, supplies the gate electrode of the output stage transistor with a charging current;
    a discharge transistor, which, when the output stage transistor is turned off, supplies the gate electrode of the output stage transistor with a discharge current; and
    a turn-off control unit, which, when the output stage transistor is turned off, supplies the gate electrode with an additional discharge current during a first time interval and turns off the additional discharge current after the first time interval, the turn-off control unit comprising:
    a voltage determination unit for determining a voltage at the drain electrode of the output stage transistor, the voltage determination unit emitting a drain voltage signal on the basis of the voltage present at the drain electrode of the output stage transistor;
    a turn-off control logic unit, which receives the drive signal and the drain voltage signal and on the basis thereof generates a discharge current control signal;
    a transmission gate that is driven by the discharge current control signal; and
    a bipolar fast-discharge transistor, whereby the transmission gate is looped in series with the collector-emitter section of the fast-discharge transistor between the gate electrode of the output stage transistor and a reference potential or ground.

2. The integrated circuit according to claim 1, wherein a turn-on control unit, which, when the output stage transistor is turned on, supplies the gate electrode with an additional charging current during a second time interval and turns off the additional charging current after the second time interval.

3. The integrated circuit according to claim 2, wherein the turn-on control unit comprises:
  a switching state determination unit for determining a switching state of the output stage transistor, the switching state determination unit emitting a switching state signal dependent on the switching state of the output stage transistor;
  a turn-on control logic unit, which receives the drive signal and the switching state signal and depending thereon generates a charging current control signal; and
  a fast-charge transistor, which is driven by the charging current control signal, for providing the additional charging current, the fast-charge transistor being looped between a supply voltage and the gate electrode of the output stage transistor.

4. The integrated circuit according to claim 3, wherein the switching state determination unit comprises:
  a first sensor transistor whose gate electrode is connected to the gate electrode of the output stage transistor; and
  a first sensor current source being looped in series with the drain-source section of the first sensor transistor between the supply voltage and a reference potential or ground, wherein the switching state signal is present at the drain electrode of the first sensor transistor (T2).

5. The integrated circuit according to claim 1, wherein the voltage determination unit comprises:
  a second sensor transistor, whose gate electrode is connected to the supply voltage; and
  a second sensor current source, whereby the drain-source section of the second sensor transistor and the second sensor current source are looped in series between the drain electrode of the output stage transistor and a reference potential or ground, and the drain voltage signal is present at the source electrode of the second sensor transistor.

6. The integrated circuit according to claim 1, wherein the turn-off control unit comprises:
  a fast-discharge release transistor;
  a fast-discharge release transistor drive unit for driving the fast-discharge release transistor, which receives a voltage present at the base electrode of the fast-discharge transistor and as a function thereof switches on or blocks the fast-discharge release transistor; and
  a fast-discharge current source, wherein a drain-source section of the fast-discharge release transistor and the fast-discharge current source are looped in series between the base electrode of the fast-discharge transistor and a reference potential or ground.

7. The integrated circuit according to claim 1, wherein the turn-off control unit comprises:
  an integration capacitor; and
  an integration current source, wherein an integration capacitor and an integration current source are looped in series between the drain voltage signal and a reference potential or around, and a connecting node between the integration capacitor and the integration current source is connected to the base electrode of the fast-discharge transistor.

8. The integrated circuit according to claim 1, further comprising:
  a pull-down resistor, which is looped between the gate electrode of the output stage transistor and a reference potential or ground; and
  a compensation unit that compensates for a current, caused by the pull down resistor, from the gate electrode to the reference potential.

9. The integrated circuit according to claim 8, wherein the compensation unit comprises:
  a sensor resistor, whose electrical properties coincide substantially with the electrical properties of the pull-down resistor;
  a voltage follower unit, which taps off the voltage present at the pull-down resistor in a high-impedance manner and applies it to the sensor resistor in a low-impedance manner;
  a current measuring unit, which measures the current flowing through the sensor resistor; and
  a controlled compensation current source for supplying a compensation current to the gate electrode of the output stage transistor.

10. The integrated circuit according to claim 1, wherein the output stage transistor is a MOS output stage transistor.

* * * * *